United States Patent
Young et al.

(10) Patent No.: US 9,177,634 B1
(45) Date of Patent: Nov. 3, 2015

(54) TWO GATE PITCH FPGA MEMORY CELL

(71) Applicant: Xilinx, Inc., San Jose, CA (US)

(72) Inventors: Steven P. Young, Boulder, CO (US); Yang Song, Milpitas, CA (US); Nui Chong, Cupertino, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/172,835

(22) Filed: Feb. 4, 2014

(51) Int. Cl.
*H01L 27/11* (2006.01)
*G11C 11/412* (2006.01)
*G11C 11/41* (2006.01)
*H03K 19/177* (2006.01)

(52) U.S. Cl.
CPC .............. *G11C 11/41* (2013.01); *H03K 19/177* (2013.01); *H01L 27/1104* (2013.01)

(58) Field of Classification Search
CPC ................ H01L 27/11; H01L 27/1104; H01L 27/11807
USPC .................. 257/206, 208, 211, 903, E27.098, 257/E27.099
See application file for complete search history.

(56) References Cited

U.S. PATENT DOCUMENTS

| | | | |
|---|---|---|---|
| 5,554,874 A * | 9/1996 | Doluca | 257/390 |
| 6,229,186 B1 * | 5/2001 | Ishida | 257/390 |
| 7,132,851 B2 | 11/2006 | Young | |
| 7,956,421 B2 * | 6/2011 | Becker | 257/369 |
| 2011/0103137 A1 * | 5/2011 | Beat | 365/156 |
| 2012/0275207 A1 * | 11/2012 | Houston et al. | 365/72 |

* cited by examiner

*Primary Examiner* — Allison P Bernstein
(74) *Attorney, Agent, or Firm* — Gerald Chan (57) ABSTRACT

A memory cell includes a first inverter and a second inverter, wherein the first inverter and second inverter are cross-coupled using a storage node and an inverse storage node; a data node and an inverse data node, wherein the data node and inverse data node are next to a first side of the memory cell; and an address line controlling access to the storage node and the inverse storage node by the data and inverse data nodes; wherein the memory cell comprises a two gate pitch memory cell.

16 Claims, 6 Drawing Sheets

TWO GATE PITCH FPGA MEMORY CELL

FIELD

An embodiment described herein relates to memory cells for field programmable gate arrays (FPGAs).

BACKGROUND

Memory cells for FPGAs have many requirements and limitations that are different from those for other types of memory cell, such as those for static random access memory (SRAM). For example, while the storage nodes of conventional SRAM memory only interact with the word or address line and the data lines of the memory cell array, the storage nodes of FPGA memory cells are used to directly connect to neighboring circuitry (e.g., multiplexers (MUX)) in order to configure the logic of the FPGA. In some FPGAs, the memory cells may be arranged in single rows or columns adjacent to the circuitry that they configure.

SUMMARY

A memory cell includes: a first inverter and a second inverter, wherein the first inverter and second inverter are cross-coupled using a storage node and an inverse storage node; a data node and an inverse data node, wherein the data node and inverse data node are next to a first side of the memory cell; and an address line controlling access to the storage node and the inverse storage node by the data and inverse data nodes; wherein the memory cell comprises a two gate pitch memory cell.

Optionally, a gate of the first inverter is aligned with a gate of the second inverter.

Optionally, the memory cell further includes a first poly track, wherein the gates of the first and second inverters are implemented on the first poly track.

Optionally, the memory cell further includes a second poly track, wherein the address line is implemented on the second poly track.

Optionally, the first and second inverters have substantially a same size.

Optionally, at least one of the storage and inverse storage nodes are at least partially implemented using a contact layer.

Optionally, the memory cell further includes a plurality of poly tracks defining a gate direction, wherein the address line is orthogonal to the gate direction.

Optionally, the memory cell further includes a plurality of poly tracks defining a gate direction, wherein the data and inverse data nodes are connected to data lines that are parallel to the gate direction.

Optionally, the first side of the memory cell is configured to face a side of an adjacent memory cell, and wherein the data node and the inverse data node are shared between the memory cell and the adjacent memory cell.

Optionally, the memory cell is a part of a FPGA.

Optionally, the FPGA further includes neighboring circuitry next to the memory cell, wherein the neighboring circuitry is connected to the storage and inverse storage nodes of the memory cell, and has one or more MUXs.

Optionally, one of the storage node and the inverse storage node is connected to the neighboring circuitry through a poly track, and the other one of the storage node and the inverse storage node is connected to the neighboring circuitry through a gate metal.

An integrated circuit includes: a plurality of memory cells; wherein one of the memory cells comprises: a first inverter and a second inverter, wherein the first inverter and second inverter are cross-coupled using a storage node and an inverse storage node; a data node and an inverse data node, wherein the data node and inverse data node are next to a first side of the memory cell; and an address line controlling access to the storage node and the inverse storage node by the data and inverse data nodes; wherein the memory cell comprises a two gate pitch memory cell.

Optionally, the plurality of memory cells comprises at least four memory cells, and wherein the integrated circuit further comprises a data line connecting data nodes of the at least four memory cells.

Optionally, the data line is parallel to a gate direction of the memory cells.

Optionally, the at least four memory cells have different respective address lines.

Optionally, the address lines of the at least four memory cells are orthogonal to a gate direction of the memory cells.

Optionally, the data node and the inverse data node of the one of the memory cells are shared with another one of the memory cells that is adjacent the one of the memory cells.

Optionally, the integrated circuit further includes neighboring circuitry next to the plurality of memory cells, wherein the neighboring circuitry and the memory cells form parts of a FPGA.

Optionally, the plurality of memory cells are arranged in a plurality of rows, wherein the one of the memory cells is in a first row of the plurality of rows, and shares the address line with at least one of the memory cells in a second row of the plurality of rows.

Other and further aspects and features will be evident from reading the following detailed description.

BRIEF DESCRIPTION OF THE DRAWINGS

The drawings illustrate the design and utility of various features described herein, in which similar elements are referred to by common reference numerals. In order to better appreciate how the above-recited and other advantages and objects are obtained, a more particular description will be rendered, which are illustrated in the accompanying drawings. These drawings depict only exemplary features and are not therefore to be considered limiting in the scope of the claims.

FIG. 1-1 illustrates a two gate pitch SRAM memory cell.

FIG. 1-2 illustrates an array of SRAM memory cells.

FIG. 3-1 illustrates a two gate pitch FPGA memory cell in accordance with some embodiments.

FIG. 3-2 illustrates a row of two gate pitch memory cells in accordance with some embodiments.

FIG. 3-3 illustrates a configuration for two rows of two gate pitch memory cells in accordance with some embodiments.

DETAILED DESCRIPTION

Various features are described hereinafter with reference to the figures. It should be noted that the figures are not drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments, even if not so illustrated, or if not explicitly described. Also, reference throughout this specification to "some embodiments" or "other embodiments" means that a particular feature, structure, material, or characteristic described in connection with the embodiments is included in at least one embodiment. Thus, the appearances of the phrase "in some embodiments" or "in other embodiments" in various places throughout this specification are not necessarily referring to the same embodiment or embodiments.

In order to save space on a FPGA, it may be desirable for the memory cells and MUXs of the FPGA to be as compact as possible. As a result, a two gate pitch memory cell (a memory cell that occupies two columns of poly-silicon (poly or poly track) in the layout) may be desirable as it would better align with the natural layout of the neighboring MUXs, allowing them to be laid out in less area than would otherwise be required if memory cells of different pitches (e.g., three pitch) were used. New two gate pitch memory cells are provided herein because conventional two pitch SRAM memory cells are incompatible with FPGAs. In one or more embodiments described herein, a two gate pitch memory cell includes a first inverter and a second inverter, wherein the first inverter and second inverter are cross-coupled using a storage node and an inverse storage node. The memory cell also includes a data node and an inverse data node, wherein the data node and inverse data node are next to a first side of the memory cell. By placing the data node and the inverse data node next to a same side of the memory cell, data lines are able to be configured to be parallel to the gate direction of the memory cell. Also, such configuration allows the data node and the inverse data node to be shared between adjacent memory cells. In addition, the two gate pitch memory cell allows the inverters to have substantially a same size. Furthermore, in one or more embodiments of the two gate pitch memory cell, the poly tracks of the memory cell are perpendicular to a direction in which the memory cells are aligned. Such configuration allows the poly tracks to conveniently reach the neighboring circuitry of a FPGA. Also, such configuration allows a row of memory cells to be conveniently terminated without the need to implement boundary circuitry.

Figure 11:
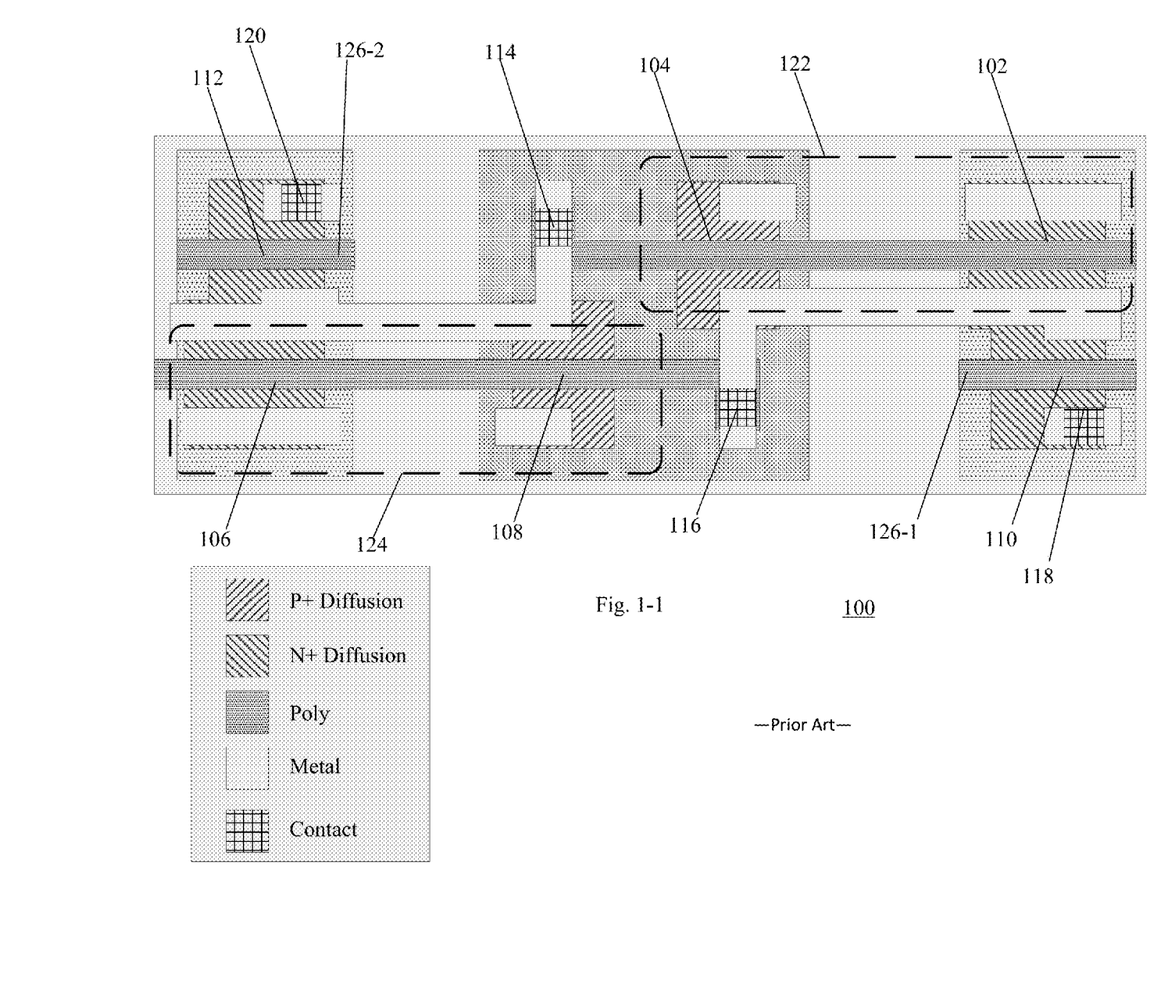

FIG. 1-1 illustrates a two gate pitch SRAM memory cell 100. SRAM cell 100 comprises six transistors (two PMOS transistors 104 and 108, and four NMOS transistors 102, 106, 110, and 112). PMOS transistor 104 and NMOS transistor 102 form a first inverter 122, and PMOS transistor 108 and NMOS transistor 106 form a second invertor 124. Ground and voltages lines (not shown) may be implemented in a metal layer to contact the transistors. For the purposes of this specification, the ground the voltage lines for the memory cell 100 are assumed to be in the metal 1 layer, although it will be understood that the ground and voltage lines may be implemented in other layers in various other embodiments.

Storage nodes (hereinafter, Q and Qbar nodes, wherein bar denotes an inverse node) 114, 116 are used to cross-couple the first and second invertors in order to store the data contained in the memory cell 100. It should be noted that Q node is an example of storage node, and that Qbar node is an example of inverse storage node. An address or word line (126-1, 126-2), hereinafter referred to collectively as address line, connects the gates of the remaining NMOS transistors 110, 112, which are used to control access to the Q and Qbar nodes 114, 116 by the data or bitline nodes (hereinafter, D and Dbar nodes) 118, 120. D and Dbar nodes 118, 120 may be used to both read and write data to the Q and Qbar nodes 114, 116. It should be noted that D node is an example of data node, and that Dbar node is an example of inverse data node.

Because the D and Dbar nodes 118, 120 are on opposite sides of the SRAM memory cell 100, the address lines 126-1, 126-2 connect through a higher metal layer, such as metal 2 (not shown). This increases the number of metal layers needed to implement the memory cell 100.

Figure 12:
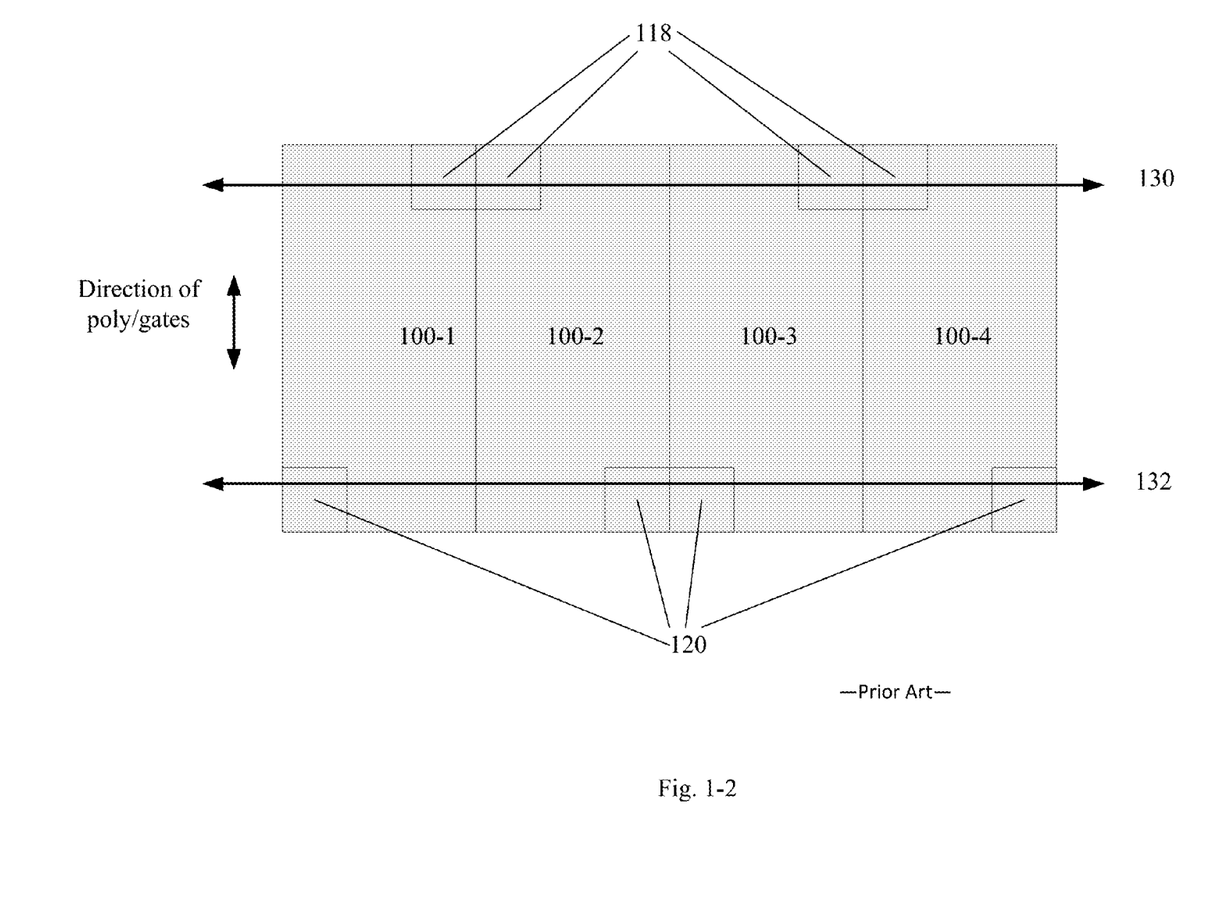

FPGA memory cells have a number of layout requirements that prevent usages of the SRAM memory cell layout in FPGAs. For example, in a SRAM memory cell, D and Dbar connections are shared between neighboring cells in an alternating arrangement. FIG. 1-2 illustrates a row of four SRAM memory cells (100-1, 100-2, 100-3, and 100-4), each of which has the configuration like that shown in FIG. 1-1. In the arrangement of the SRAM memory cells of FIG. 1-2, D and Dbar connections are shared between neighboring memory cells. For example, memory cell 100-2 shares its D node 118 with memory cell 100-1, and its Dbar node 120 with memory cell 100-3. Because SRAM memory cells may be part of a large continuous arrays, the D and Dbar nodes may be easily interleaved. However, the memory cell array cannot be broken without having to create specialized boundary circuitry for the D and Dbar nodes located at the edges of the array.

On the other hand, due to their role of directly controlling neighboring circuitry (e.g., MUXs), FPGA memory cells may be arranged in single rows or columns. Thus, there is a greater need to be able to have a clean break between memory cells in an FPGA without having to create specialized boundary circuitry.

In addition, because the configuration values used to configure the logic of the FPGA are stored in the storage nodes (Q and Qbar nodes) of the FPGA memory cell, it is necessary for the Q and Qbar nodes of the FPGA memory cells to be able to exit the memory cell so that they directly connected to neighboring circuitry in order to pass the values.

Typically, the Q and Qbar nodes are connected to neighboring logic using poly (poly track) or gate metal, in order to avoid excessive use of metal layers and to save area for connections. This is very different from typical SRAM memory cells, wherein the Q and Qbar nodes only interact with the address lines (word lines) and data lines (D and Dbar nodes). This imposes memory cell orientation and boundary requirements that are typically not compatible with SRAM memory cell array layouts. For example, because address line is divided in two sections (126-1 and 126-2, as illustrated in FIG. 1-1) due to D and Dbar nodes 118, 120 being on opposite sides of the memory cell 100, it is necessary to use an extra metal layer in order to connect them, which in an FPGA memory cell could have been used to route a Q or Qbar node to neighboring logic.

Also, in SRAM memory cells, the D and Dbar lines 130, 132 typically run orthogonal to the gate direction (see FIG. 1-2), while the address lines run parallel to the gate direction. In some embodiments, a gate direction of a memory cell may be defined by a direction of poly tracks in the memory cell. This is typically incompatible with the needs of FPGA memory cells, which need to enable frame by frame configuration of the FPGA so that customers can perform configuration of different part sizes, partial reconfiguration, and recover from multi-bit upsets. As a result, FPGA memory cells may require the D and Dbar lines to be parallel to the gate direction, and the address lines to be orthogonal to the gate direction, which is the opposite of the layout of convention SRAM memory cells.

One or more embodiments described herein provide a FPGA memory cells layout that is easily divisible, avoids excessive use of metal layers, and wherein the DB and DB lines run parallel to the gate direction.

Figure 2:
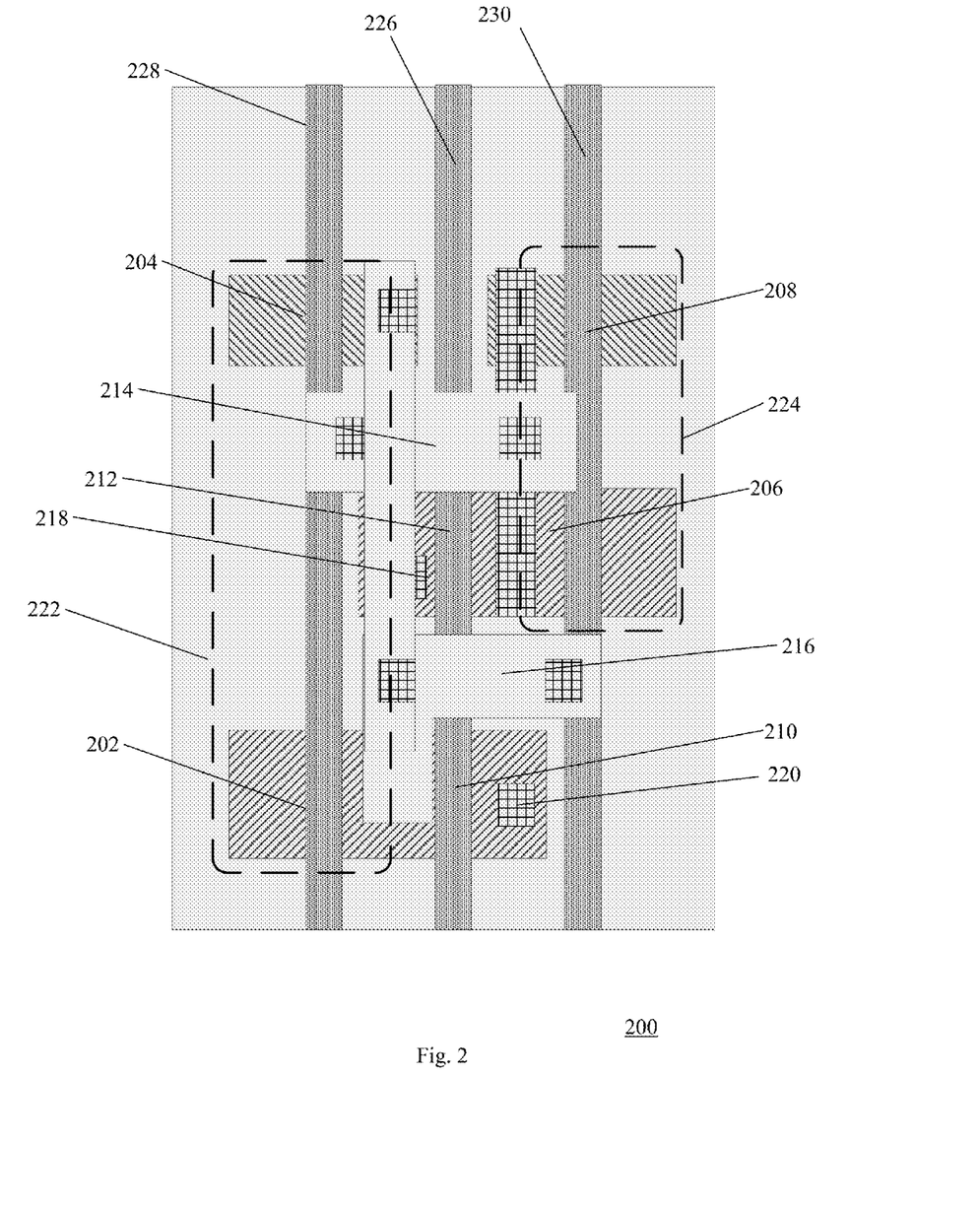
FIG. 2 illustrates a three gate pitch FPGA memory cell.

FIG. 2 illustrates a three pitch FPGA memory cell 200. Memory cell 200 comprises an address line 226, a first inverter 222 comprising transistors 202, 204, and a second inverter 224 comprising transistors 206, 208. Q and Qbar nodes 214, 216 are used to cross-couple the first and second inverters 222, 224. Transistors 210, 212 control access of the Q and Qbar nodes 216, 214 by the data line (D and Dbar nodes 220, 218). In the illustrated embodiment, transistors 204, 208 are PMOS transistors, while transistors 202, 206 are NMOS transistors. The PMOS transistors 204, 208 are located near one side (e.g., the top side) of the memory cell 200.

The layout of FPGA memory cell 200 solves a number of the problems that make SRAM memory cell 100 inadequate for use in FPGAs. For example, the D and Dbar nodes 218, 220 of the FPGA memory cell 200 are located within the memory cell, and the longitudinal directions of the D and Dbar nodes 218, 220 run vertically with respect to the configuration shown in FIG. 2. With this configuration, when there are multiple FPGA memory cells that are aligned in a row (e.g., when there are additional FPGA memory cells to the left and right of the FPGA memory cell 200) in a first direction (e.g., horizontal direction), the D and Dbar nodes 218, 220 are not shared between neighboring FPGA memory cells, and the D and Dbar lines comprising the D and Dbar nodes 218, 220 are in a second direction that is different (e.g., perpendicular) from the first direction. This allows for the row of the FPGA memory cells to be easily terminated without the need for creating boundary circuitry for D or Dbar nodes on the edge of the memory cells. For example, if the FPGA memory cell 200 in FIG. 2 is the last FPGA memory cell 200 in a row (e.g., there are one or more additional FPGA memory cell to the left of the FPGA memory cell 200), then boundary circuitry at the right edge of the FPGA memory cell 200 are not needed for the D or Dbar nodes. This is because the D and Dbar lines comprising the D and Dbar nodes 218, 220 run in a direction that is perpendicular to the direction of the row of the FPGA memory cells.

In addition, the Q and Qbar nodes 214, 216 of the FPGA memory cell 200 are able to be directly connected to the neighboring circuitry. For example, Q node 214 is connected to poly track 228, Qbar node 216 is connected to poly track 230, while a third poly track functions as the address line 226. The poly tracks of the memory cell 200 define a gate direction of the memory cell 200. Thus Q and Qbar nodes 214, 216 are able to directly reach and connect to controlled logic (not shown) located above memory cell 200.

However, the three-pitch FPGA memory cell 200 is less efficient in area utilization. As can be seen in FIG. 2, each row of transistors contains room for three transistors, but only two transistors are actually used, resulting in a 33% waste of potential transistor area. In particular, the first row of transistors 204, 208 has an un-used space between the transistors 204, 208 that can otherwise be used accommodate another transistor or another circuit component. The second row of transistors 206, 212 has an un-used space to the left of the transistor 212 that can otherwise be used to accommodate another transistor or another circuit component. Also, the third row of transistors 202, 210 has an un-used space to the right of the transistor 210 that can otherwise be used to accommodate another transistor or another circuit component.

Also, the two inverters 222, 224 of the three pitch FPGA memory cell 200 are non-symmetrical, in that the first inverter 222 comprising transistors 202, 204 is larger than the second inverter 224 comprising transistors 206, 208. While non-symmetrical inverters may be used in some embodiments in order to bias the wakeup state of the FPGA memory cell, in other embodiments, it may be desirable for FPGA memory cell performance to have the two inverters be symmetrical (e.g., the same size), as it may reduce mismatch and improve process margins and yields.

Figure 31:
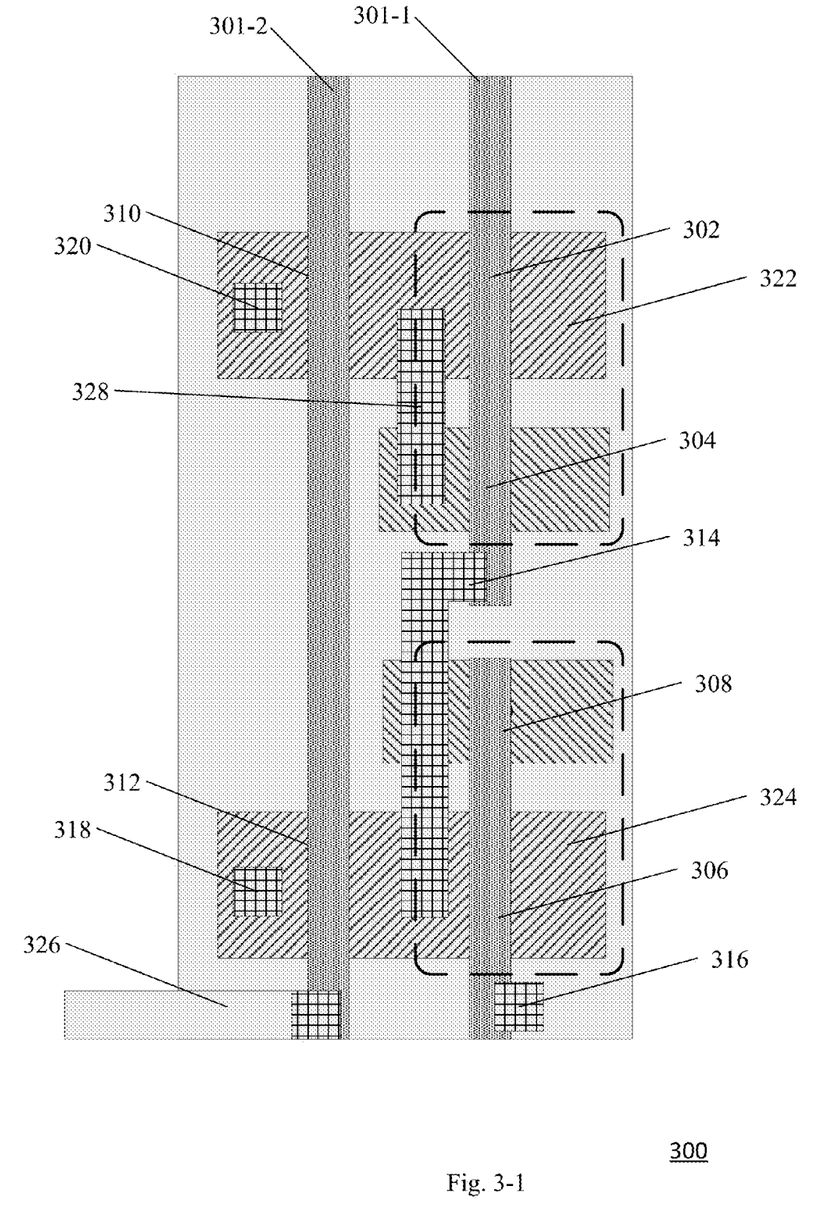

FIG. 3-1 illustrates a two gate pitch FPGA memory cell 300 in accordance with some embodiments. The FPGA memory cell 300 has two poly tracks 301-1, 301-2, wherein the direction of the poly tracks 301-1, 301-2 defines the gate direction of the memory cell 300. In the illustrated embodiments, the memory cell 300 has only two poly tracks 301-1, 301-2, and therefore the memory cell 300 is a two gate pitch memory cell. In some embodiments, the memory cell 300 may be used with 16 nm or 20 nm gate channel length (illustrated in layout as the short side of the channel—aka "width") layout technologies, such as 20 nm technology provided by TSMC, Inc. In other embodiments, different layout sizes may be used. The memory cell 300 comprises a first inverter 322 formed by transistors 302, 304, and a second inverter 324 formed by transistors 306 and 308. Q and Qbar nodes 314, 316 are used to cross-couple first and second inverters 322, 324. The memory cell 300 also includes transistors 310, 312. An address line 326 connects the gates of the transistors 310, 312, which control access of Q and Qbar nodes 314, 316 by D and Dbar nodes 318, 320.

In the illustrated embodiment, transistors 304, 308 are PMOS transistors, while transistors 302, 306 are NMOS transistors. The PMOS transistors 304, 308 may be located near the middle of the memory cell 300, while NMOS transistor 302, 306, and the transistors 310, 312 may be located in the outer regions of the memory cell 300.

The layout of the memory cell 300 allows for gates of inverters 322, 324 to be aligned. In some embodiments, the gates of the inverters 322, 324 may be formed from the same poly track 301-1, wherein the poly track 301-1 is cut between PMOS 304 and 308 using a cut mask.

Because the gates of both inverters 322, 324 are aligned on the same poly track 301-1, the second poly track 301-2 of the two gate pitch memory cell 300 allows for an unbroken address line 326 to be connected to gates of the transistors 310, 312, unlike that of the SRAM memory cell 100. This saves the need for having to use an extra metal layer connection to connect two separate sections of an address line.

In some embodiments, at least one of the Q and Qbar nodes 314, 316 is implemented using a contact layer. The contact layer may be a M0_PO (a trench contact for the polyoxide (PO) or gate) and/or M0_OD layer (a trench contact for the oxide diffusion (OD) layer), which may be, for example, implemented in TSMC 20 nm technology. The contact layer acts as a contact that touches a diffusion layer, but also has sufficient size to function as a connection, essentially acting as an additional metal layer. For example, as illustrated in FIG. 3-1, Q node 314 is formed by coupling the output of inverter 324 (diffusion layer) and the gate of inverter 322 (poly layer) together through the contact layer. On the other hand, Qbar node 316 may be formed by coupling the gate of inverter 324 and output of inverter 322, which may be routed using a metal layer, such as metal 2 (not shown, connecting 316 and 328). In some embodiments, the Qbar node 316 may be partially implemented in the contact layer (e.g., at 328, connecting the drains of transistors 302 and 304). The Q node 314 may then be connected to neighboring circuitry using the poly track, while the Qbar node 316 may be connected to neighboring circuitry via a metal layer (e.g., metal 2).

By implementing one of the cross-connections in the contact layer, the layout of the memory cell 300 may be made to be more compressed, allowing D and Dbar nodes 318, 320 to be aligned, instead of being offset as that shown in the SRAM memory cell 100, or the three-pitch FPGA memory cell 200 (wherein the D and Dbar nodes 218, 220 have a half pitch offset). This creates a single straight line defining the boundary of the memory cell 300. It will be understood that while the illustrated embodiment shows the Q node being formed using the contact layer and the Qbar node using a metal layer, in other embodiments the Qbar node may be formed on the contact layer and the Q node on the metal layer.

Due to the layout of the neighboring circuitry controlled by the FPGA memory cell 300, the memory cell layout with the two gate pitch configuration tends to be more efficient compared to the FPGA memory cell 200 with the three gate pitch configuration. In addition, in some embodiments, one of the poly tracks may be connected directly into the neighboring circuits, providing a free track for routing. In some embodiments, using a two pitch FPGA memory cell allows for increased utilization of the free routing provided by the poly tracks compared to the two pitch FPGA memory cell. This is because in the three pitch FPGA memory cell 200, even though both Q and Qbar nodes 214, 216 are routed on poly track within the memory cell 200, due to the memory cell interfacing with circuitry configured for two gate pitch, one of the Q and Qbar nodes 214, 216 will need to be rerouted using a metal layer, such that only one in three poly tracks are able to be used to directly connect a Q or Qbar node 214/216 to the neighboring circuitry.

The layout of two-pitch memory cell 300 also allows for the inverters 322, 324 to be substantially the same size (e.g., size difference being less than 10%). By preserving inverter symmetry, the performance of the FPGA memory cell 300 may be improved in some embodiments. In other embodiments, the distance between the transistors of inverters 322, 324 may be configured such that the inverters are different sizes.

Figure 32:
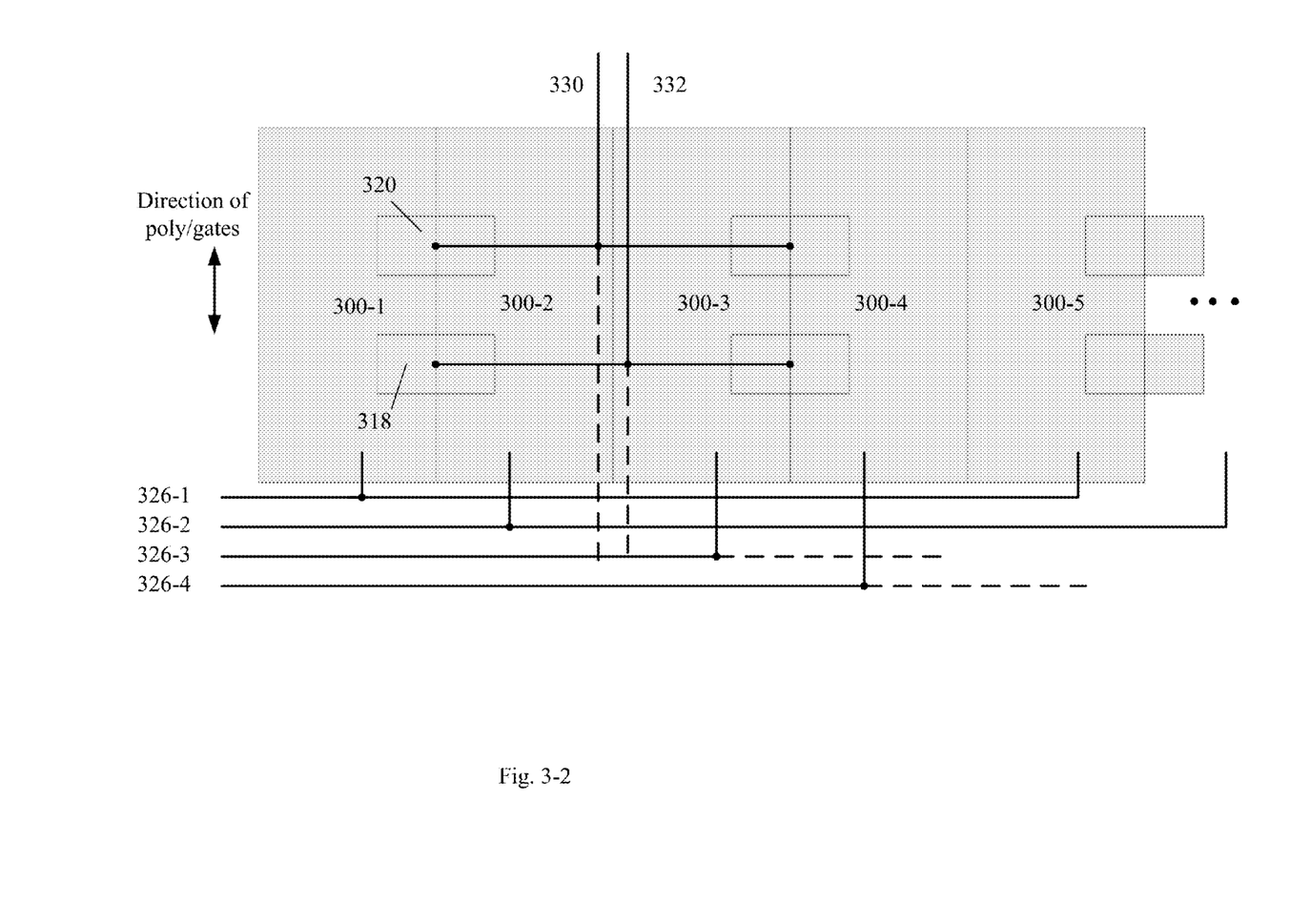

Because the D and Dbar nodes 318, 320 are next to the same side (e.g., edge) of the memory cell 300, while the power and ground nodes are on the opposite side (e.g., edge) of the memory cell 300, a convenient boundary is created for the memory cell 300. For example, FIG. 3-2 illustrates a row of FPGA memory cells wherein groups of four FPGA memory cells (300-1, 300-2, 300-3, and 300-4) share D and Dbar lines (collectively, data lines), but are connected to different address lines. Pairs of memory cells (300-1 and 300-2, 300-3 and 300-4) share D and Dbar nodes 318 and 320. Pairs of D and Dbar nodes on different pairs of memory cells may be connected by data lines 332 and 330. In the illustrated example, the memory cell 300-1 and the memory cell 300-2 share D and Dbar nodes 318, 320. Similarly, the memory cell 300-3 and the memory cell 300-4 share D and Dbar nodes 318, 320. The D nodes 318 from the first pair of memory cells 300-1, 300-2 and from the second pair of memory cells 300-3, 300-4 are connected to data line 330. The Dbar nodes 320 from the first pair of memory cells 300-1, 300-2 and from the second pair of memory cells 300-3, 300-4 are connected to data line 332.

In some embodiments, the D and Dbar nodes 318, 320 are considered to be next to a side of the memory cell 300 if they are positioned along an edge of the memory cell 300. In other embodiments, the D and Dbar nodes 318, 320 are considered to be next to a side of the memory cell 300 if they overlap (e.g., extend over) an edge of the memory cell 300. In further embodiments, the D and Dbar nodes 318, 320 are considered to be next to a side of the memory cell 300 if they are away from an edge of the memory cell 300, but there is no poly track between the D and Dbar nodes 318, 320 and the edge of the memory cell 300.

By placing the D and Dbar nodes 318, 320 next to a same side of the memory cells 300, the data lines 330, 332 are able to be configured to be parallel to the gate direction of the memory cells 300.

In some embodiments, the address lines 326 for a row of FPGA memory cells are configured to be orthogonal to the gate direction of the memory cells (see FIG. 3-2, wherein address lines 326-1, 326-2, 326-3, and 326-4 for the respective FPGA memory cells 300-1, 300-2, 300-3, 300-4 are configured to be orthogonal to the gate direction) and the direction of the data lines 330, 332. In some embodiments, the address lines 326 may be implemented in the metal 3 layer, while the data lines 330, 332 are implemented in the metal 4 layer. In other embodiments, the address lines 326 may be implemented in other layers. Also, in other embodiments, the data lines 330, 332 may be implemented in other layers.

In some embodiments, as illustrated in FIG. 3-2, running the address lines 326 and data lines 330, 332 orthogonally to each other allows for a clump of adjacent memory cells to share data lines for D and Dbar, while being connected to multiple separate address lines 326. This creates a larger physical separation between memory cells sharing the same address line (e.g., 300-1 and 300-5 sharing address line 326-1). This separation is important when an SEU (Single Event Upset) flips multiple neighboring memory cells. When this happens, ECC (Error-correcting code) may be used to correct the flips as the memory cells sharing a single address line would only experience one flip from the SEU.

In addition, by allowing data line pairs 330, 332 to span multiple memory cells, the number of data lines needed to run over neighboring logic is reduced. However, this is at the expense of having to have additional address lines, as each memory cell 300 should have a distinct address line/data line combination. While the illustrated configuration shows groups of four memory cells 300 sharing data lines 330, 332 and having respective four address lines 326, it will be understood that different configurations with different numbers of data lines and address lines are possible. For example, in an alternate embodiment, a row of four memory cells may have two address lines 326 and two pairs of data lines, wherein each address line 326 and data line pair is connected to two memory cells.

Figure 33:
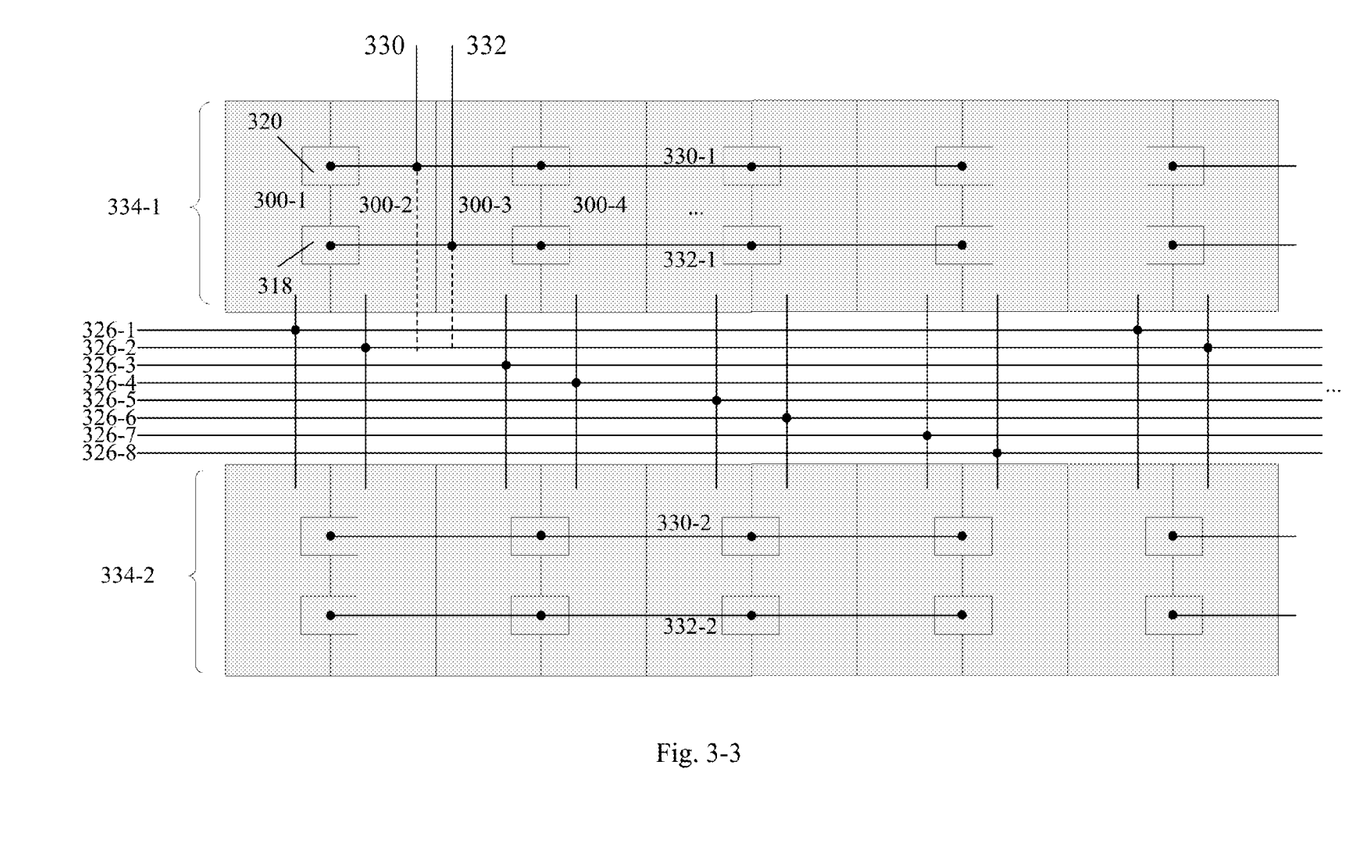

FIG. 3-3 illustrates an embodiment having two neighboring rows 334-1, 334-2 of memory cells 300, wherein the layout of the memory cells 300 in each row are mirrored. The memory cells 300 of rows 334-1 and 334-2 are configured to share the same address lines 326. In some embodiments, corresponding memory cells in the two rows may have their address lines connected to the same poly track (301-2, as illustrated in FIG. 3-1). By having a single address line 326 fan out to pairs of memory cells 300, a more compact layout may be achieved.

In the illustrated configuration, the data lines 330 and 332 are configured to span twice as many memory cells 300 (eight memory cells 300 instead of four as illustrated in FIG. 3-2). However, the reduced number of data lines may correspond with an increased number of address lines (8 instead of 4), such that each memory cell 300 has a unique data line/address line combination. It shall be understood that while FIG. 3-3 illustrates rows 334-1 and 334-2 as being spaced apart for illustrative purposes, in an actual layout rows 334-1 and 334-2 may be immediately adjacent to each other.

Although particular features have been shown and described, it will be understood that they are not intended to limit the claimed invention, and it will be clear to those skilled in the art that various changes and modifications may be made without departing from the scope of the claimed invention.

The specification and drawings are, accordingly, to be regarded in an illustrative rather than restrictive sense. The claimed invention is intended to cover alternatives, modifications, and equivalents.

The invention claimed is:

1. A memory cell comprising:
   a first inverter and a second inverter, wherein the first inverter and second inverter are cross-coupled using a storage node and an inverse storage node;
   a first poly track, wherein a gate of the first inverter and a gate of the second inverter are implemented on the first poly track;
   a data node and an inverse data node, wherein the data node and inverse data node are next to a first side of the memory cell; and
   an address line controlling access to the storage node and the inverse storage node by the data and inverse data nodes;
   wherein the memory cell comprises a two gate pitch memory cell.

2. The memory cell of claim 1, further comprising a second poly track, wherein the address line is implemented on the second poly track.

3. The memory cell of claim 1, wherein the first and second inverters have substantially a same size.

4. The memory cell of claim 1, wherein at least one of the storage and inverse storage nodes are at least partially implemented using a contact layer.

5. The memory cell of claim 1, further comprising a second poly track, the first poly track and the second poly track defining a gate direction, wherein the address line is orthogonal to the gate direction.

6. The memory cell of claim 1, further comprising a second poly track, the first poly track and the second poly track defining a gate direction, wherein the data and inverse data nodes are connected to data lines that are parallel to the gate direction.

7. The memory cell of claim 1, wherein the first side of the memory cell is configured to face a side of an adjacent memory cell, and wherein the data node and the inverse data node are shared between the memory cell and the adjacent memory cell.

8. A FPGA comprising the memory cell of claim 1.

9. The FPGA of claim 8, further comprising neighboring circuitry next to the memory cell, wherein the neighboring circuitry is connected to the storage and inverse storage nodes of the memory cell, and has one or more MUXs.

10. The FPGA of claim 9, wherein one of the storage node and the inverse storage node is connected to the neighboring circuitry through the first poly track, and the other one of the storage node and the inverse storage node is connected to the neighboring circuitry through a gate metal.

11. An integrated circuit, comprising:
    a plurality of memory cells having at least four memory cells arranged in a first row;
    a data line connecting the at least four memory cells;
    wherein one of the at least four memory cells comprises:
       a first inverter and a second inverter, wherein the first inverter and second inverter are cross-coupled using a storage node and an inverse storage node;
       a data node and an inverse data node, wherein the data node and inverse data node are next to a first side of the one of the memory cells; and
       an address line controlling access to the storage node and the inverse storage node by the data and inverse data nodes;
       wherein the one of the at least four memory cells comprises a two gate pitch memory cell; and
       wherein the data node and the inverse data node of the one of the at least four memory cells are shared with another one of the at least four memory cells that is next to the one of the at least four memory cells.

12. The integrated circuit of claim 11, wherein the data line is parallel to a gate direction of the plurality of memory cells.

13. The integrated circuit of claim 11, wherein the at least four memory cells have different respective address lines.

14. The integrated circuit of claim 13, wherein the address lines of the at least four memory cells are orthogonal to a gate direction of the at least four memory cells.

15. The integrated circuit of claim 11, further comprising neighboring circuitry next to the plurality of memory cells, wherein the neighboring circuitry and the plurality of memory cells form parts of a FPGA.

16. The integrated circuit of claim 11, further comprising an additional plurality of memory cells arranged in a second row, wherein the one of the at least four memory cells in the first row shares the address line with at least one of the memory cells in the second row.

\* \* \* \* \*